United States Patent [19]
Doughty et al.

[11] Patent Number: 6,163,006
[45] Date of Patent: Dec. 19, 2000

[54] PERMANENT MAGNET ECR PLASMA SOURCE WITH MAGNETIC FIELD OPTIMIZATION

[75] Inventors: Frank C. Doughty; John E. Spencer, both of Plano, Tex.

[73] Assignee: ASTeX-PlasmaQuest, Inc., Wilmington, Mass.

[21] Appl. No.: 09/019,573

[22] Filed: Feb. 6, 1998

[51] Int. Cl.[7] .................................................. B23K 9/00
[52] U.S. Cl. ................................. 219/121.43; 204/298.16
[58] Field of Search .............................. 219/121.43, 686; 204/298.16, 298.37; 315/111.41; 438/712, 732

[56] References Cited

U.S. PATENT DOCUMENTS

| | | | |
|---|---|---|---|
| 4,259,145 | 3/1981 | Harper et al. | 438/712 |
| 4,433,228 | 2/1984 | Nishimatsu et al. | 219/686 |
| 4,483,737 | 11/1984 | Mantei | 438/732 |
| 4,761,219 | 8/1988 | Sasaki et al. | 204/298.37 |
| 5,022,977 | 6/1991 | Matsuoka et al. | 204/298.16 |
| 5,173,641 | 12/1992 | Imahashi et al. | 315/111.41 |
| 5,280,219 | 1/1994 | Ghanbari | 315/111.41 |

*Primary Examiner*—Teresa Walberg
*Assistant Examiner*—Quang Van
*Attorney, Agent, or Firm*—Testa, Hurwitz & Thibeault, LLP

[57] ABSTRACT

In a plasma-producing device, an optimized magnet field for electron cyclotron resonance plasma generation is provided by a shaped pole piece. The shaped pole piece adjusts spacing between the magnet and the resonance zone, creates a convex or concave resonance zone, and decreases stray fields between the resonance zone and the workpiece. For a cylindrical permanent magnet, the pole piece includes a disk adjacent the magnet together with an annular cylindrical sidewall structure axially aligned with the magnet and extending from the base around the permanent magnet. The pole piece directs magnetic field lines into the resonance zone, moving the resonance zone further from the face of the magnet. Additional permanent magnets or magnet arrays may be utilized to control field contours on a local scale. Rather than a permeable material, the sidewall structure may be composed of an annular cylindrical magnetic material having a polarity opposite that of the permanent magnet, creating convex regions in the resonance zone. An annular disk-shaped recurve section at the end of the sidewall structure forms magnetic mirrors keeping the plasma off the pole piece. A recurve section composed of magnetic material having a radial polarity forms convex regions and/or magnetic mirrors within the resonance zone.

7 Claims, 6 Drawing Sheets

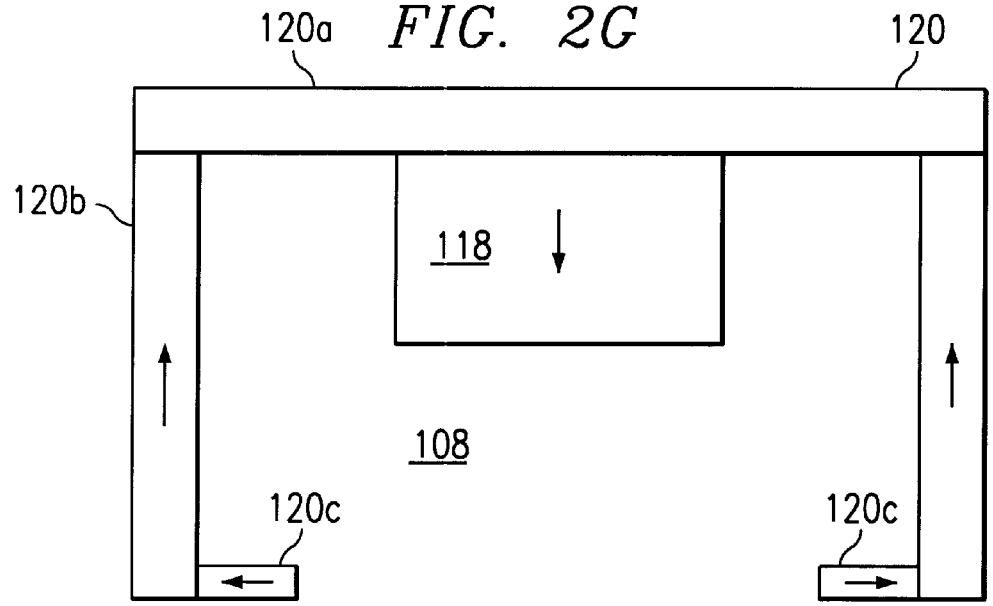
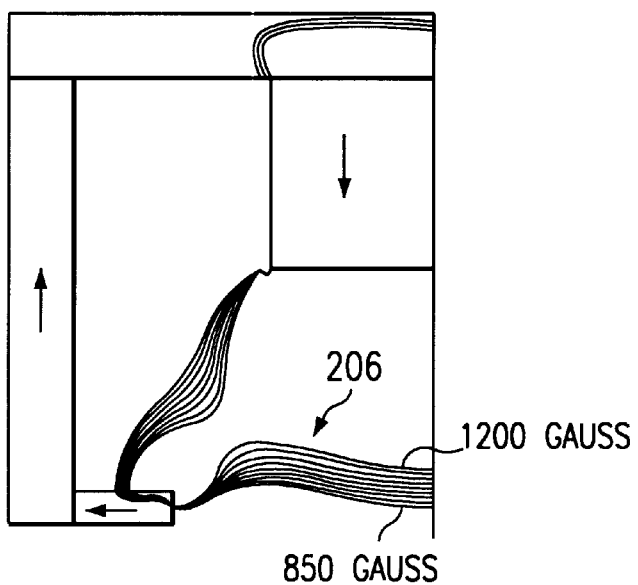

PERMANENT MAGNET ECR PLASMA SOURCE WITH MAGNETIC FIELD OPTIMIZATION

BACKGROUND OF THE INVENTION

1. Technical Field

The present invention relates generally to plasma-producing devices, and in particular to electron cyclotron resonance plasma-producing devices. More particularly, the invention relates to electron cyclotron resonance plasma-producing devices employing a permanent magnet and shaped pole piece to control resonance zone location and plasma uniformity.

2. Description of the Related Art

Plasma producing devices are commonly employed in microelectronic device fabrication and similar industries requiring formation of extremely small geometries. Plasma producing devices may be utilized in plasma-assisted processing to etch geometries into a substrate or to deposit a layer or layers of material on the substrate.

One class of such plasma producing devices employs a magnetic field in conjunction with microwave energy. In these devices, plasma is produced from a working gas as a result of the interaction of a magnetic field with an electric field. A microwave waveguide may be employed to inject microwaves, which have an associated electric field, into an evacuable chamber containing the working gas. The microwaves propagate into the chamber in a direction substantially perpendicular to the surface of the workpiece. The electric field associated with the microwaves is perpendicular to the direction of propagation, radially outward from a line following the direction of propagation of the microwaves. Plasma ions from the working gas are accelerated by the electric field along such radial lines.

A magnetic field is provided in a direction generally aligned with the direction of microwave propagation, causing plasma electrons within the working gas to rotate around the direction of microwave propagation at right angles with the magnetic field. At the plane of resonance, the point at which the electric field associated with the microwave energy and the rotation of plasma electrons are in phase, the microwave electric field constantly accelerates the rotating plasma electrons. The energy of this acceleration dissociates molecules of the working gas into atoms and removes electrons from the atoms, creating ions and additional electrons. The ions then diffuse and impinge upon the exposed surface of the workpiece.

The requisite magnetic field may be provided by a single permanent magnet situated above the outlet of the microwave waveguide into the chamber. An adjusting element may be provided to vary the spatial relationship between the magnet and the waveguide opening, thus altering the location of the plane of resonance or "resonance zone" within the chamber.

While use of a permanent magnet situated over the waveguide opening to the chamber has advantages over other plasma producing methods, a permanent magnet of the size required to provide the requisite magnetic field may be very expensive. Additionally, plasma uniformity across the surface of the workpiece is generally necessary to achieve etched geometries or deposited layers having relatively uniform dimensions from the center to the periphery of the workpiece surface. Prior art attempts to obtain plasma uniformity have focused on achieving a uniform magnetic field, which requires very large and bulky magnets. Another drawback of the use of permanent magnets in plasma producing devices relates to the necessity of positioning the microwave waveguide between the permanent magnet and the workpiece. This constrains placement of the permanent magnet with respect to the chamber, and as the magnet face is moved further from the chamber, larger, more expensive magnets are required to produce the requisite magnetic field.

One solution to these difficulties is described in U.S. patent application Ser. No. 08/770,316, which teaches the use of a reduced height waveguide with a rectangular-to-circular transmission mode converter, allowing the face of the permanent magnet to be moved closer to the resonance zone. Since magnetic field strength is inversely related to the square of the distance ($\sim 1/d^2$) for a dipole, this placement of the magnet closer to the resonance zone allows a smaller, less powerful magnet to realize the same magnetic field in the resonance zone. Although permanent magnets and electromagnets do not provide magnetic field which are precisely those of a magnetic dipole, both provide fields having predominantly dipole characteristics. Closer to a permanent magnet, more substantial deviations from a dipole may be found.

The above-identified patent application also discloses the benefits of employing a return piece (also called a "pole piece") adjacent the pole of the permanent magnet which is opposite the waveguide and evacuable chamber. The return piece, which may be composed of soft iron, short circuits the magnetic field emanating from the surface of the permanent magnet adjacent to the return piece, increasing the "effective height" or perceived magnetic strength of the permanent magnet. The return piece compensates for magnetic flux which would be generated by a larger magnet, allowing a smaller permanent magnet to produce a magnetic field having the strength equal to that produced by a similar magnet (without the return piece) of a larger height. Since the magnetic materials are typically very expensive, the ability to utilize a smaller permanent magnet to produce the requisite magnetic field at the resonance zone improves the commercial viability of the plasma producing device. Employing a return piece also reduces stray magnetic fields beyond the return piece.

The return piece described, particularly with optional sidewalls extending from the return piece and forming a "sheath" around the permanent magnet, provides some ability to shape and direct the magnetic field produced by the permanent magnet, and to minimize stray magnetic fields around the magnet. Control over both the direction of the magnetic field lines produced by the permanent magnet in the resonance zone and stray magnetic fields may thus be achieved. Additionally, the magnetic field near the workpiece may be minimized, resulting in an inherent increase plasma uniformity.

It would be desirable, however, to provide control over shaping of the magnetic field to achieve benefits in plasma processing. It would further be advantageous to adjust field strength and shape through positioning and/or shaping of a pole piece in a permanent magnet assembly for a plasma-producing device.

SUMMARY OF THE INVENTION

In a plasma-producing device, an optimized magnet field for electron cyclotron resonance plasma generation is provided by a shaped pole piece. The shaped pole piece adjusts spacing between the magnet and the resonance zone, creates a convex or concave resonance zone, and decreases stray fields between the resonance zone and the workpiece.

For a cylindrical permanent magnet, the pole piece includes a disk adjacent the magnet together with an annular cylindrical sidewall structure axially aligned with the magnet and extending from the base around the permanent magnet. The length of the sidewall portion of the pole piece is greater than the height of the permanent magnet, extending beyond the plane of the magnet face opposite the base. The pole piece directs magnetic field lines into the resonance zone, moving the resonance zone further from the face of the magnet.

Additional permanent magnets or magnet arrays may be utilized to control field contours on a local scale. Rather than a permeable material, the sidewall structure may be composed of an annular cylindrical magnetic material having a polarity opposite that of the permanent magnet, creating convex regions in the resonance zone. An annular disk-shaped recurve section at the end of the sidewall structure forms magnetic mirrors keeping the plasma off the pole piece. A recurve section composed of magnetic material having a radial polarity forms convex regions and/or magnetic mirrors within the resonance zone.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 2A, 2C, 2E, and 2G are diagrams of alternative configurations for a permanent magnet magnetic field source providing a resonance zone with a shaped contour and rapid decay of the magnetic field away from the source in accordance with a preferred embodiment of the present invention;

FIGS. 2B, 2D, 2F, and 2H are diagrams of magnetic field strength simulations for permanent magnet magnetic field source configurations in accordance with a preferred embodiment of the present invention;

DETAILED DESCRIPTION

Figure 1:
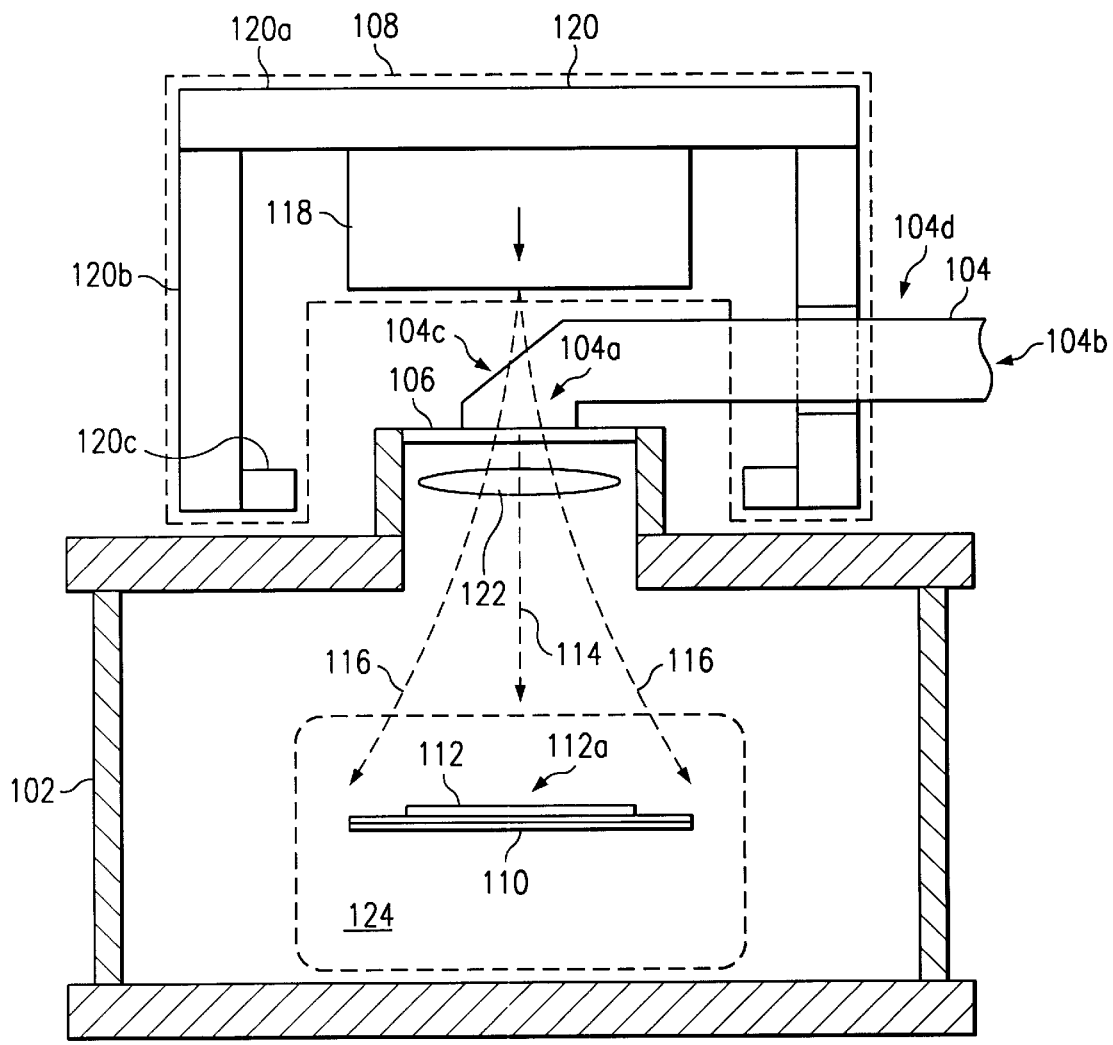
FIG. 1 depicts a cross-sectional view of a portion of a plasma producing device in accordance with a preferred embodiment of the present invention.

With reference now to the figures, and in particular with reference to FIG. 1, a cross-sectional view of a portion of a plasma producing device in accordance with a preferred embodiment of the present invention is depicted. For clarity, the components depicted are not drawn to scale and some elements of the total construction of a plasma-producing device are not depicted. Only so much of the structure as is necessary to understand the present invention is shown.

The plasma producing device includes evacuable chamber 102 with a waveguide 104 situated adjacent chamber 102 having an outlet 104a proximate to a window 106 constructed of material transparent to microwave radiation, such as quartz or aluminum oxide, and located in an opening in chamber 102. Waveguide 104 is connected at an inlet 104b to a microwave power generation source and matching network (not shown) and conveys microwave energy produced by the generating source along its length to outlet 104a proximately situated to window 106. Waveguide 104 is preferably a rectangular waveguide, may be constructed from brass or aluminum, and is preferably a half-height or reduced height waveguide in the region where waveguide 104 intervenes between evacuable chamber 102 and magnetic field source 108.

Waveguides such as waveguide 104 are generally dimensioned according to the frequency of the microwave energy to be transmitted. Microwave energy having a frequency of about 2.45 GHz has been found generally suitable for plasma-producing devices. For 2.45 GHz microwave energy, a WR284 waveguide, with internal dimensions of 2.84 by 1.34 inches and a frequency range including 2.45 GHz, or a WR340 waveguide, which has internal dimensions of 3.40 by 1.70 inches and a frequency range of 2.1 to 3.00 GHz, may be utilized. However, for efficient transport of microwave energy in a rectangular waveguide, the most important dimension of the waveguide is the horizontal (width) dimension, while the vertical (height) dimension may be reduced with a slight increase in loss but no change in transmission mode. Thus, waveguide 104 preferably tapers from a standard sized waveguide at the generating source to a reduced height waveguide having smaller vertical dimension at a region 104d where waveguide 104 begins to intervene between evacuable chamber 102 and magnet field source 108. The reduced height waveguide allows magnetic field source 108 to be placed closer to outlet 104a while maintaining acceptable power levels and suitable transmission distances.

Waveguide 104 may also include a rectangular-to-circular transmission mode converter at the elbow 104c leading to outlet 104a, and may be filled with a material such as Teflon®, which has a higher dielectric constant than air and thus permits a smaller waveguide to be employed. When waveguide 104 is dielectrically loaded, the dimensions are scaled from the inverse of the square root of the dielectric constant.

A support 110 located in the interior of evacuable chamber 102 holds workpiece 112 during processing, and may be electrically biased to create an electric field attracting plasma ions from the resonance zone. Microwave energy exiting waveguide 104 at outlet 104a passes through window 106 and propagates, preferably in a circular transmission mode, within chamber 102 in a direction 114 substantially perpendicular to the exposed processing surface 112a of workpiece 112. Close to the resonance zone, magnetic field lines 116 of the magnetic field generated by magnetic field source 108 are substantially aligned with the direction 114 of microwave energy propagation. That is, a line connecting the poles of the magnetic field is substantially aligned with, and along the same line as, the direction of propagation of the microwave energy. Microwave energy thus propagates from outlet 104a of waveguide 104 in a direction aligned with a predominant axial magnetic field component produced by magnetic field source 108, which extends through waveguide 104 and window 106 into chamber 102. A resonance zone is thus formed where the electric field associated with the microwave energy is in phase with the electron cyclotron motion of the plasma electrons.

Magnetic field source 108 in the depicted example is proximate to waveguide 104 on the opposite side from outlet 104a and evacuable chamber 102. Magnetic field source 108 in the preferred embodiment is a permanent magnet 118 and a pole piece 120. Pole piece 120 includes a base 120a adjacent the pole of permanent magnet 118 furthest from workpiece 112, sidewalls 120b extending from the periphery of base 120a substantially parallel to magnet 118, and recurve sections 120c extending from the ends of sidewalls 120b furthest from base 120a toward the center of magnetic field source 108. Magnetic field source 108 (and thus magnetic field lines 116), outlet 104a (and thus the direction 114 of microwave energy propagation), and work-piece support 110 may all be axially aligned as depicted.

Magnetic field source 108 comprised of permanent magnet 118 and shaped pole piece 120 constructed as described in further detail below are employed to generate a uniform plasma at the surface of workpiece 112. Electron cyclotron resonance (ECR) plasma resonance requires a magnetic field determined by the resonance condition $\omega=eB/m$, where $\omega$ is the angular frequency of the microwave energy ($2\pi f$, where f is the frequency in Hertz), e is the well-known constant electronic charge (approximately $1.6\times10^{-19}$ C), B is the magnetic field strength in Gauss, and m is electron mass. For microwave energy at 2.45 GHz, a field strength of 875 G is required to create this resonance condition for electrons. Additionally, to achieve high ion density in the source and hence high ion currents at the workpiece, it is preferable to have a plasma density greater than the critical plasma density $n_c$ (an "overdense" plasma), where $n_c$ is defined by:

$$\omega = \frac{4\pi n_c e^2}{m}$$

where $\omega$ is the desired angular frequency for microwave energy to be coupled to the plasma (here, $2\pi\times2.45$ GHz). For microwave energy with a frequency of 2.45 GHz, the resonance zone critical density is approximately $7\times10^{10}$ $cm^3$, above which high ion fluxes to workpiece 112 may be achieved.

Unfortunately, electromagnetic (EM) waves, including microwaves, generally will not propagate through regions of plasma density greater than the critical density. Instead, microwaves are reflected by regions exceeding the critical density and thus will not reach the resonance zone. The consequence is that, once the plasma density reaches the critical density, additional power cannot be added to the plasma and the density cannot be increased above the critical density. One exception to this general result is right hand circularly polarized waves, which may propagate through plasma regions exceeding the critical density provided the magnetic field strength is greater than that required for resonance. This is described in many works on plasma physics. In the case of microwave energy at 2.45 GHz as described earlier, this requires a magnetic field strength greater than 875 G. By achieving the launch condition of magnetic field strength in excess of that required for resonance with microwave energy of a given frequency, referred to as high field injection, a resonance zone with a plasma density greater than the critical density may be formed within evacuable chamber 102. High field injection is therefore a critical aspect of plasma source and launcher design.

Plasma uniformity is desirable in most plasma processing systems. There are two general sources of plasma nonuniformity: 1) nonuniformity in the absorption or plasma generating region; and 2) nonuniformity in the transport or movement of the plasma between the generation zone and the workpiece. Uniformity of plasma generation requires that a uniform absorption be achieved, including a uniform microwave field pattern and a uniform magnetic field (resonance zone). Since the absorption and field patterns are interrelated, the ability to manipulate and control the magnetic field configurations (position of the resonance zone and local curvature of the resonance zone shape) on a local scale is critical to achieving a highly uniform absorption. "Local scale" refers to lengths smaller than the characteristics size of the permanent magnet. The magnetic field varies relatively slowly across lengths smaller than the characteristic size. For example, a permanent magnet in the form of a cube which is 6 inches on each side, or in the form of a cylinder with a 12 inch diameter bore, will produce magnetic fields which do not change rapidly over dimensions of about 3 inches, with the possible exception of regions adjacent the magnet.

In practice, it may be extremely difficult to generate a perfectly uniform plasma. Thus, some degree of homogenization of the plasma between the source and the workpiece would be desirable. This would allow local non-uniformities in the source to diffuse out, thus "smearing out" any non-uniformities present in the source region. In a magnetized plasma, however, diffusion of charged particles may be influenced substantially by the magnetic field. In particular, diffusion perpendicular to the magnetic field lines is slowed proportionally to the inverse square of the magnetic field strength. Due to this, it is desirable to achieve as low a magnetic field as possible in the region between the plasma generation (resonance) zone and the workpiece.

One source of plasma nonuniformity is cross-field diffusion. The substantial difference between ion and electron masses means that diffusion parallel to magnetic field lines 116 is led by electrons, which, having higher mobility, tend to leave a region more quickly than ions. However, this results in a positive charge (the ions) remaining in that region, resulting in an electric field which retards diffusion of the electrons. On the other hand, because electrons are confined to gyrate about magnetic field lines 116, plasma diffusion perpendicular to magnetic field lines 116 is limited, led by the lower mobility ions. Thus, the varying mobility of ions and electrons leads to variations in potential, and ultimately difficulties in achieving plasma uniformity. Plasma variations in one part of the system may be mapped to other areas down the magnetic field lines due to the slow diffusion across field lines.

Plasma variations at the workpiece may also arise from spatial variations in the divergence of the magnetic field. In a collisionless plasma (no cross field diffusion), plasma will travel down the magnetic field lines to the workpiece and the plasma density at any point will be proportional to the field strength at that point. Assuming the plasma is generated uniformly at the resonance zone (875 G), the plasma density at a point where the field strength is 87.5 Gauss would be 1/10th that of the resonance zone. If the field strength across the workpiece varies, the plasma density will vary commensurately. At lower magnetic fields, cross field diffusion will be enhanced and the effects of magnetic field strength variations will be minimized. Thus lower magnetic fields between the plasma generation zone and the workpiece, together with a controlled divergence of the field lines, is desirable.

An additional source of plasma variations arises from changes in the magnetic field magnitude (grad B parallel to B, where B is the magnetic field strength and direction at a given location and grad B is the rate of change of the magnetic field strength at a given location in a given direction). Converging field lines may form magnetic mirrors for electrons traveling in the direction of grad B>0, while electrons traveling parallel to grad B<0 may be accelerated. These variations in magnetic field magnitude lead to variations in plasma density and potential, and ultimately to variations in plasma processes at workpiece 112 (e.g., variations in ion density/current and plasma potential/energy).

There are several approaches to achieving plasma uniformity despite the problems described. One solution is to attempt to achieve uniform transport of the plasma from the resonance zone to the workpiece 112. However, this is a complicated task since diffusion across the fields depends in part on pressure and plasma parameters, and thus on the process window. The required magnetic field is therefore specific to a certain process and set of plasma conditions. Moreover, engineering the magnetic fields typically involves placing a large electromagnetic coil close to the plane of workpiece 112 and biasing the coil either to focus the magnetic field lines from the ECR absorption region on workpiece 112 or to form a null field region immediately adjacent to working surface 112a of workpiece 112. The electromagnets required for this solution are extremely bulky, expensive, and difficult to handle. Because the electromagnet must be much larger than the diameter of workpiece 112, the problems associated with this solution become worse as the substrate size (of workpiece 112) increases. Furthermore, field engineering is generally only viable for a small range of pressures and powers, limiting process development.

A second approach to achieving plasma uniformity is to attempt to achieve a zero field region throughout evacuable chamber 102 outside the resonance zone. This may involve use of a magnetic bucket to confine the plasma away from the walls of chamber 102. However, the magnetic field within evacuable chamber 102 may not be arbitrarily low since the magnetic field magnitude required for resonance must still be achieved. Alternatively, high field injection (operation above the critical plasma density) may be abandoned as in Distributed Electron Cyclotron Reactor (DECR) and Microwave Plasma Disk Reactor (MPDR) plasma devices. In such devices, small resonance zone are created by bucket magnets around the periphery of evacuable chamber 102, with the microwave energy being coupled to the resonance zone either via an antenna or via a tuned resonance cavity. These plasma sources are confined to a low density operating regime where expansion of the plasma into a larger volume is impractical. A distributed plasma is created so that uniformity must be obtained by achieving uniform excitation of the plasma, involving practical problems which have not yet been commercially solved.

A third approach to achieving plasma processing uniformity involves creation of a dense plasma resonance zone 122 (greater than the critical plasma density) followed by diffusion of plasma ions into a low field processing region 124 adjacent workpiece 112. High field injection may be achieved by utilizing a diverging magnetic field 116 with microwave energy 114 propagating into a region with a magnetic field having a magnitude in excess of that required for resonance (greater than 875 G for microwave energy at a frequency of 2.45 GHz). Unfortunately, the condition that the total divergence of the magnetic field be null (div B=0) implies that all field lines must close upon themselves. A magnetic field configuration consisting of an 875 G region which then rapidly falls to zero is physically difficult to achieve. Electromagnets generally have a circular form with a bore diameter larger (12–14 inches or more) than the diameter of window 106 (about 6–10 inches in diameter). The magnetic fields of such electromagnets fall off as dipole fields in the far field—that is, proportional to $1/z^3$ for separations along the z direction (the axis of the electromagnet) greater than the coil diameter. The magnetic fields of electromagnets fall off much more slowly in the near field (points along the z direction less than the coil diameter) as a function of:

$$\frac{1}{(z^2+d^2)^{\frac{3}{2}}}$$

Plasma-producing devices usually operate in the near field.

Permanent magnet sources provide some advantage in achieving plasma process uniformity by a dense plasma region followed by a low field region. The lateral dimension of a permanent magnet is somewhat smaller than the lateral dimension of a electromagnet having corresponding strength (typically about 4–6 inches in diameter), so that the crossover to the dipole field regime in the far field occurs somewhat closer to the magnet. The need to fit waveguide 104 between magnetic field source 108 and the resonance zone requires some distance between the permanent magnet and the resonance zone. Coupling of the microwave energy to a region of magnetic field strength of at least that required for resonance therefore may occur in the near field, but not directly at the face. The magnetic field should thus fall from fairly high values, approximately 3000–5000 G, to a much smaller field strength at the working surface 112a of workpiece 112. For magnetic field strengths of about 50–100 G at workpiece 112, the gyro radius of a 3 electron-volts (eV) electron is 1 mm and the magnetic field still has a substantial effect on diffusion of the electron. If the magnetic field strength is lowered to 5 G, the gyro radius increases to 1 cm and the magnetic field has less effect. The larger gyro radius results in better diffusion and better plasma uniformity.

Referring now to FIGS. 2A–2H, alternative configurations for a permanent magnet magnetic field source providing a resonance zone with a shaped contour and rapid decay of the magnetic field away from the source in accordance with a preferred embodiment of the present invention are illustrated. The magnetic field sources of the present invention may be employed to overcome the influence of diverging magnetic field lines on both plasma parameters and processing (ion currents and energies). Magnetic field sources implemented in accordance with the present invention permit small scale field modifications.

Figure 2A:
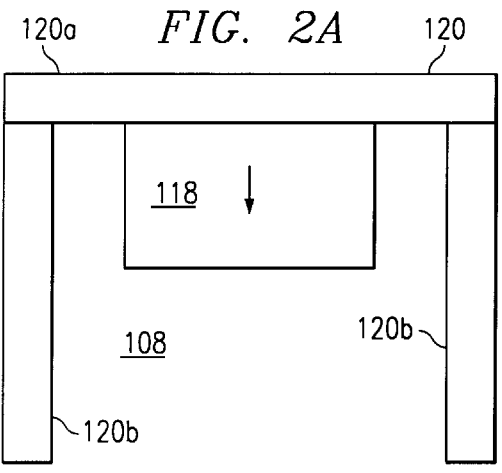

FIG. 2A depicts a simple magnetic field source 108 including a permanent magnet 118 and a pole piece 120 including a base 120a and sidewalls 120b. Permanent magnet 118 may be composed of a magnetic compound such as neodymium-iron-boron (Nd—Fe—B) or samarium-cobalt (Sm—Co). Although depicted as having a five inch diameter and three inch height, permanent magnet 118 with as small as a one inch height may be suitable for plasma-producing devices. Pole piece 120 is mounted adjacent to the surface of magnet 118 opposite the resonance zone and reflects or short circuits the magnetic field from the magnetic pole opposite the resonance zone, increasing the effective height of magnet 118. Pole piece 120 is composed of soft iron or high permeability steel, and should be dimensioned so that it is not saturated with magnetic field (i.e., the magnetic flux density in pole piece 120 should not be higher than the saturation value for the material of construction). Pole piece 120 is also shaped and dimensioned to increase the distance between the resonance zone and the magnet facet or the pole opposite the resonance zone in the case of an electromagnet being utilized in place of permanent magnet 118. Annular sidewall structure 120b formed of a permeable material extends past the face of permanent magnet 118 closest to the resonance zone, with a length greater than the height of permanent magnet 118. Pole piece 120 thus achieves the desired increase in the distance between magnet 118 and the resonance zone by directing the magnetic field lines into a region centered on the axis of the magnet, increasing the field strength at a given distance from the magnet face and moving the range of field strengths which include the resonance zone further from the magnet face. The basic structure also minimizes the magnetic field outside the resonance zone, causing a decrease in the field strength below the resonance zone faster than that of an electromagnetic coil or permanent magnet alone. The resonance zone is moved closer to the boundary between the near and far fields. In addition, the presence of the pole piece effectively makes the magnetic structure a higher order multipole which decays faster than a dipole in the far field region (inside the process chamber). Although illustrated as discrete components, pole piece 120 with disk-shaped base 120a and annular cylindrical sidewall structure 120b may be integrally formed of the same highly permeable material.

Figure 2B:
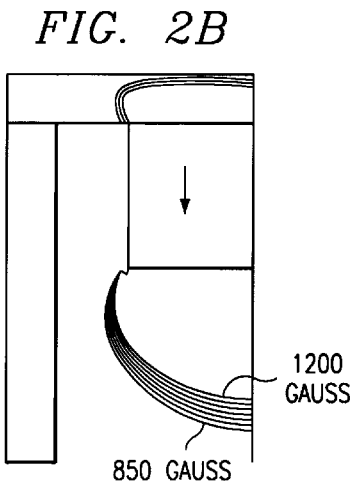

FIG. 2B illustrates a simulation of the magnetic field for the basic magnetic field source 108 illustrated in FIG. 2A. Lines of constant magnetic field strength are depicted for a range of field strengths containing the resonance zone (850–1200 Gauss). As shown, this range of field strengths is moved by the pole piece to a distance beginning about 2.5 inches to 3.0 inches from the face of the magnet. Without the pole piece, permanent magnet 118 by alone would result in the same range of field strengths beginning less than this distance from the magnet face.

Figure 2C:
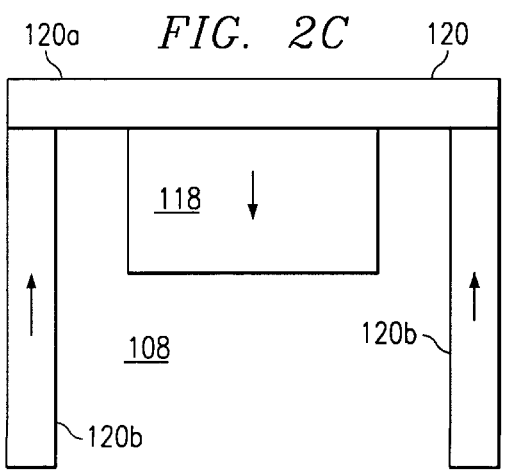

FIG. 2C depicts a variation of the basic pole piece structure in which the sidewall structure 120b is composed of a magnetic material. Annular, cylindrical sidewall structure 120b may be formed of the same material composition as permanent magnet 118, but is preferably oriented in an opposite direction, so that the magnetic fields of permanent magnet 118 and magnetic sidewall structure 120b are axially aligned but opposite in direction. In a polar coordinate system (r, φ, z), both magnetic fields are aligned with and centered on a z-axis but are of opposite magnetization directions.

Figure 2D:
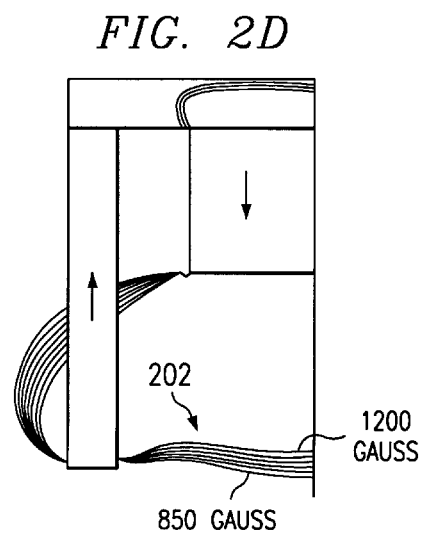

FIG. 2D illustrates a simulation of the magnetic fields for the magnetic field source 108 configuration depicted in FIG. 2C. The range of field strengths including the resonance zone are moved even further from the inner magnet face (3.5 inches to 4.0 inches). Significantly, the lines of constant magnetic field strength exhibit a convex region 202. The resonance zone with conventional magnetic field sources is normally disk-shaped with a slightly curved surface closest to the magnet and microwave waveguide outlet, typically resulting in a center peaked microwave energy absorption distribution and a corresponding center peaked plasma density in the resonance zone. By adjusting the dimensions and relative positions of magnet 118 and magnetic sidewall structure 120b, a resonance zone presenting a convex surface closest to the magnet face, where microwave energy first couples to the resonance zone, may be created. This may allow microwaves to refract from the resonance zone center along the resonance zone and be absorbed near the periphery, altering the plasma densities within the resonance zone and resulting in a more uniform plasma at the workpiece.

Alternatively, the resonance zone may be adjusted by control of the magnetic field to present a face to the microwave energy which is convex near the periphery and concave at the center. A radially peaked microwave energy absorption distribution may thus be achieved. However, both the shape of the resonance zone and the microwave energy absorption distribution are interrelated as functions of the mode structure of the microwave energy being transmitted into the resonance zone, creating an extremely complex modelling problem. The problem of creating shaped resonance zones may therefore be better suited to empirical methods.

The magnetic field source configuration depicted in FIG. 2C and modelled in FIG. 2D may also be employed to flatten the resonance zone, which may result in more uniform microwave energy absorption and plasma density. Alternatively, the concavity of the resonance zone surface closest to the magnet and waveguide outlet may be increased, and a center peaked microwave energy absorption distribution across the surface of the resonance zone formed with a sharper peak at the center than may be achieved by other configurations.

Figure 2E:
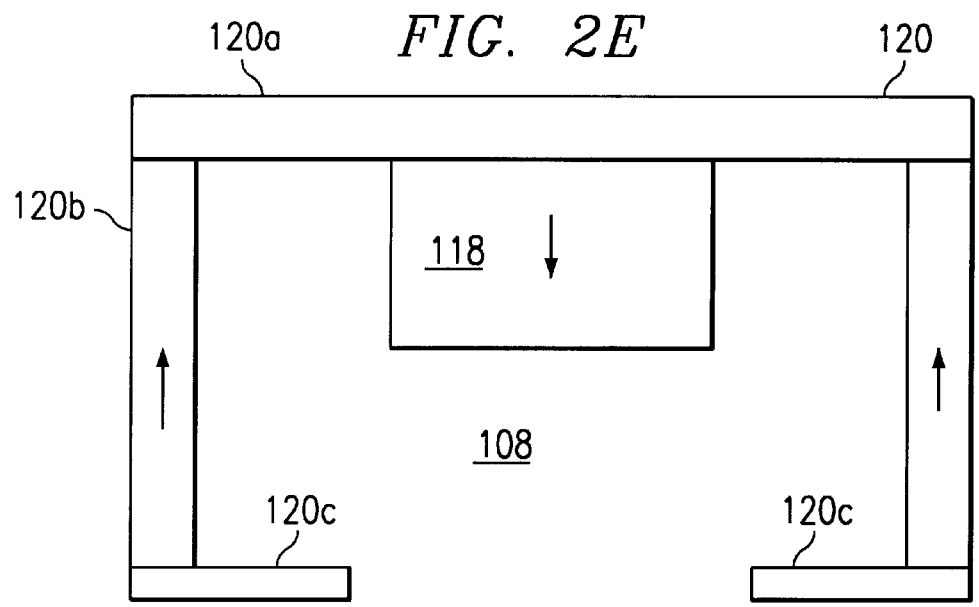
Figure 2F:
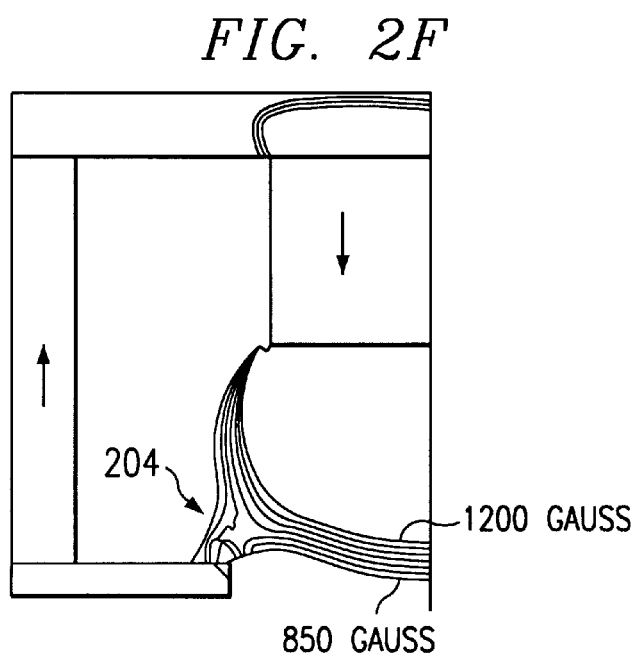

FIG. 2E illustrates another configuration for pole piece 120 within magnetic field source 108. In this embodiment, annular disk-shaped recurve section 120c formed of a permeable material is added to the end of annular, cylindrical sidewall structure 120b opposite base 120a, extending radially inward from sidewalls 120b. FIG. 2F illustrates a simulation of the magnetic fields for such a configuration. A significant feature is the magnetic mirror 204 formed by converging lines of constant magnetic field strength but opposite directions. These magnetic mirrors will act to keep plasma off the pole piece if it extends into the evacuated chamber in which the resonance zone is formed, or off the sidewalls of the evacuated chamber.

FIG. 2G illustrates still another magnetic field source configuration in which recurve section 120c is formed of a magnetic material with the magnetization direction extending radially outward from the common axis of magnet 118 and pole piece 120. The location and shape of recurve section 120c is similar to that illustrated in FIG. 2E, but the material of composition is magnetic rather than permeable, with a magnetization direction along the r-axis of a polar coordinate system aligned with magnetic field source 108. FIG. 2H illustrates a simulation of the magnetic field for such a configuration. The concave regions 206 of the lines of constant magnetic field strength indicate that, by proper selection of dimensions, both a concave resonance zone surface and/or lo magnetic mirrors at the periphery of the resonance zone may be achieved.

Various modifications to the configurations illustrated are possible, including multiple annular sidewall sections, multiple recurve sections, and multiple sidewall or recurve sections having different compositions (magnetic or permeable). Such modifications may both shape the resonance zone and further decrease fields in the process chamber below the resonance zone, and are considered to be within the spirit and scope of the present invention.

The magnetic field source configuration of the present invention produces and shapes a magnetic field resonance region with maximal spacing between the magnet face and the region of magnetic field strength required for resonance. For a 6×6×6 inch permanent magnet, the spacing between the magnet face and the region where the field strength is 875 G is approximately 3.5 inches. For a 6×6×3 inch permanent magnet of the same composition with a simple pole piece adjacent the opposite face, the distance to the 875 G line of constant magnetic field strength remains approximately the same. With a properly designed pole piece, such as those described above and depicted in the drawings, a one inch thick by five inch diameter magnet having the same composition may produce the 875 G magnet field at a spacing of greater than three inches. The high energy magnetic materials required for the permanent magnets in these configurations are very expensive and a cost savings of 4× (from about $6000 to about $1500) may be achieved by the reduction in the amount of magnetic material required.

Because the pole piece shields the magnet except in the active regions actually available for ECR resonance, the magnetic field at the workpiece is dramatically reduced. Pole pieces and/or shields which do not return parallel to the magnet to complete the magnetic circuit, such as simple annular disk-shaped shields between the magnet and the workpiece, have much less shielding effectiveness. The magnitude of the magnetic fields in the process chamber near the workpiece are important for two reasons: First, low fields mean that a magnetic multipole confinement scheme at the chamber walls works to maximum effectiveness. Second, cross field diffusion is limited by the magnetic fields which confine the electrons, so that the diffusion constant becomes $D=\rho^2/\tau$, where $\rho$ is the electron gyro radius, $\tau$ is the mean time between collisions versus $\lambda v$, and $v$ is the electron thermal velocity. The value of $1/\tau$ in processes employed within plasma-producing devices is on the order of MHz while $\rho$ is on the order of approximately 0.1–5.0 mm, so that $\rho/\tau$ is about $10^5$–$10^6$ cm$^2$/s. For free diffusion, D is approximately $10^8$–$10^9$ cm$^2$/s, so that diffusion across the magnetic field is only 1/1000th of the free diffusion speed. Decreasing magnetic fields in the process chamber near the workpiece by a factor or 10–20 (from about 100 G to about 5–10 G) results in a commensurate increase in the cross field diffusion constant.

Figure 3A:
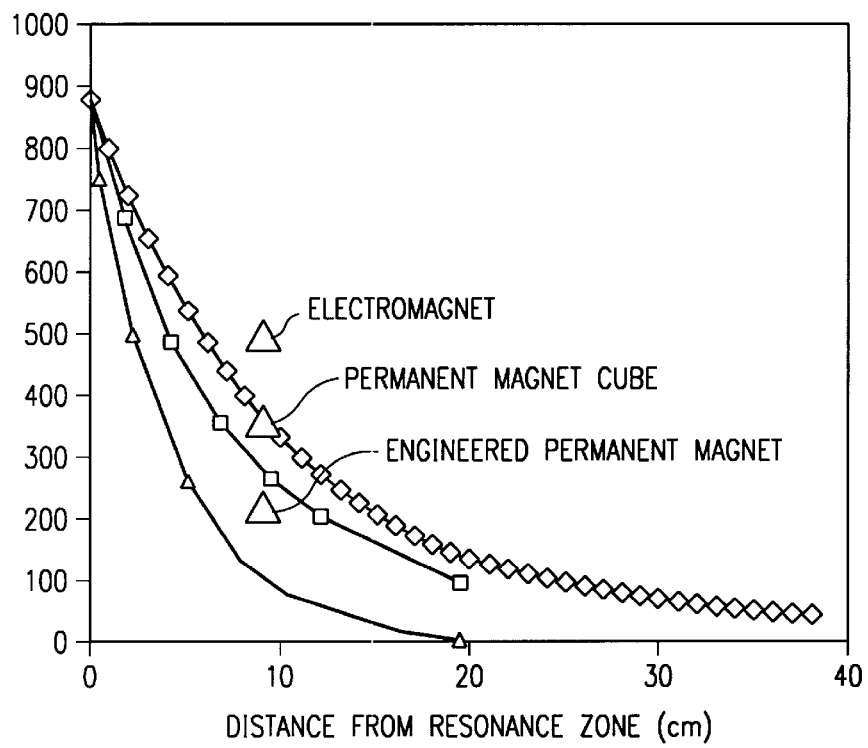
FIGS. 3A and 3B depict modeling of magnetic field strength along the major axis of the chamber and the perpendicular diffusion coefficient for the magnetic field source configuration of FIG. 2E.
Figure 3B:
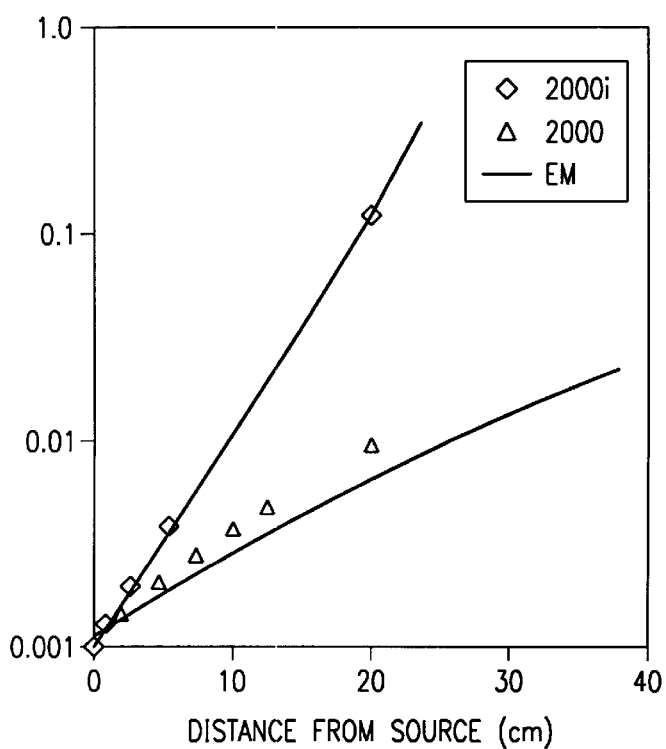

With reference now to FIGS. 3A and 3B, modeling of magnetic field strength along the major axis of the chamber and the perpendicular diffusion coefficient for the magnetic field source configuration of FIG. 2E is depicted. FIG. 3A depicts magnetic field strength in Gauss (vertical axis) plotted as a function of distance from the resonance zone in centimeters (horizontal axis). Data points for a conventional electromagnet are depicted as diamonds, data points for a permanent magnet cube without a shaped pole piece are depicted as squares, and data points for a permanent magnet with a shaped pole piece in accordance with the present invention (the embodiment of FIG. 2E) are depicted as triangles. As may be seen, at a distance of 10 centimeters from the resonance zone, the field strength of the magnetic field source of the present invention drops is less than 100 G, less than half the strength of a permanent magnet cube and less than one third the strength of an electromagnet. At the workpiece, approximately 30 centimeters from the resonance zone, the magnetic field strength of the magnetic field source of the present invention has dropped to nearly zero.

FIG. 3B depicts the electron diffusion constant (vertical axis) plotted as a function of distance from the resonance zone in centimeters (horizontal axis) . Data for a conventional electromagnet is depicted as a thick, solid line; data points for a permanent magnet cube without a shaped pole piece are depicted as triangles; and data points for a permanent magnet with a shaped pole piece in accordance with FIG. 2E are depicted as diamonds. At a distance of 20 centimeters from the source, the diffusion constant for electrons for the magnetic field source of the present invention exceeds the diffusion constant of a permanent magnet cube or an electromagnet by an order of magnitude.

Figure 4A:
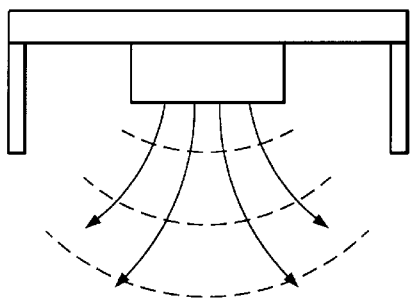
FIGS. 4A–4D are diagrams illustrating the manner in which a shaped pole piece may be employed to alter the resonance zone contour.
Figure 4B:
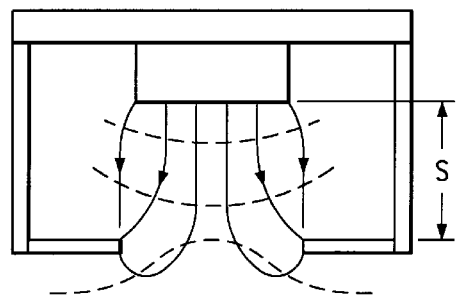
Figure 4C:
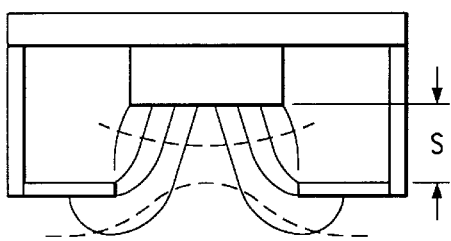
Figure 4D:
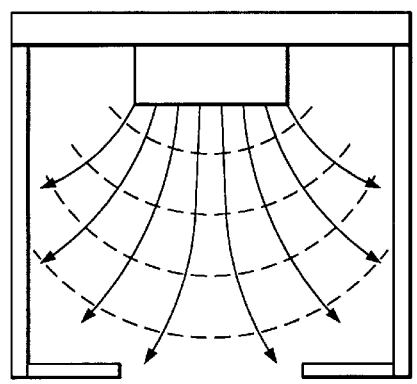

Referring now to FIGS. 4A–4D, diagrams illustrating the manner in which a shaped pole piece may be employed to alter the resonance zone contour are shown. The dashed lines indicate lines of constant magnetic field strength, any of which could be a surface of the resonance zone by altering the magnet size and strength, etc. A simple pole piece with sidewalls, illustrated in FIG. 4A, results in concentric lines of constant magnetic field strength. When recurve sections are added, as illustrated in FIG. 4B, the contours of the lines of constant field strength change shape and become dependent on the distance s between the recurve portions and the magnet face. As the spacing s between the recurve sections and the magnet face is decreased, as illustrated in FIG. 4C, the profile of the lines of constant magnetic field strength (and hence the resonance zone contour) becomes more peaked at the edges and hollow at the center. As the spacing s between the recurve sections and the magnet face increases, as illustrated in FIG. 4D, the profile of the constant field strength lines become more centrally peaked.

The shielding provided by a properly designed pole piece also creates magnetic field lines which diverge more rapidly, mapping the plasma at the workpiece from a smaller, more homogenous source region (because flux lines are continuous). If the magnetic field drops to 10 G at the workpiece, then the field lines connecting a wafer region to the magnetic field source come from an area approximately $(1/100)^{1/2}=1/10$th of the radius of the wafer region. Thus, a 12 inch diameter workpiece receives magnetic field lines from a 1.2 inch diameter region. The remaining field lines from a larger area source intersect the processing chamber walls, where magnetic mirrors from multipole plasma confinement magnets may reflect ions and electrons produced in these regions to further homogenize the plasma. In contrast, a conventional magnetic field source has a field strength at the workpiece of approximately 100 G and field lines which map from an area $(1/10)^{1/2}$ the size of the corresponding workpiece region, a factor of about 3.1 or a source of approximately 4 inches in diameter for a workpiece 12 inches in diameter. Plasma inhomogeneities in the source region map to the workpiece at the low pressure processing limit. Unfortunately, at the high pressure processing limit, the multipole magnets at the processing chamber walls cease functioning effectively as magnetic mirrors and plasma is lost to the chamber walls, leading to radial inhomogeneities. To decrease the magnetic field at the workpiece, pole pieces below the wafer serve to decrease the magnetic field downstream of the resonance zone and improve the performance factors described above.

With the magnetic field source of the present invention, the divergence of the magnetic field is more rapid close to the resonance zone, but slower close to the workpiece. As the electrons travel down the field lines from regions of high strength magnetic field to regions of lower field strength, the electrons are accelerated due to a force parallel to the magnetic field lines. This results in a change in electrical potential over length scales less than the electron mean free path. The potential change influences the ion energy and uniformity of the ion energy over the workpiece, so that reducing the magnitude of the potential change improves plasma uniformity.

The magnetic field source of the present invention also permits control of radial dependence of absorption and process uniformity. A properly designed pole piece recurving back in toward the magnet axis may be employed to control the contour of the 875 G region. When the opening in the pole is far from the magnet face, the resonance zone is concave to the incoming microwaves, similar to a conventional magnetic field source. As the opening is moved closer to the magnet face, the resonance zone flattens and then becomes convex to the incoming microwaves. Microwaves are known to refract off regions of higher density, so control over the contour of the resonance zone allows control over the radial position at which microwave energy absorption peaks, and hence control over the radial uniformity of the microwave absorption and plasma density.

The recurve portion of the pole piece also acts to concentrate flux at its inner diameter, creating small magnetic mirrors. These mirrors, together with the main magnet, form a magnetic confinement structure and serve to reduce ion bombardment of the pole piece and potentially the evacuable chamber. This also reduces plasma losses since ions cannot escape the source at these points, but instead will come out through a diverging field center section. This results in an increase in the total ion flux from the source.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A plasma processing device, comprising:
   an evacuable chamber including a window:
   a waveguide transmitting microwave energy from a source through the window into the evacuable chamber;
   a workpiece support within the evacuable chamber,
   a magnetic field source including a magnet and a pole piece including:
      a base adjacent to a first pole of the magnet; and
      sidewalls extending around the magnet from the base in a direction substantially parallel to an axis of polarity of the magnet, wherein the sidewalls have a length greater than a length of the magnet, wherein the magnet and the pole piece are configured to change the position or shape of a resonance zone; and
      recurve sections extending from the sidewalls from an end opposite the base in a direction substantially perpendicular to the axis of polarity of the magnet.

2. The plasma processing device of claim 1, wherein the recurve sections comprise a magnetic material having a polarity radial to the axis of polarity of the magnet.

3. A plasma processing device, comprising:
   an evacuable chamber including a window;
   a waveguide transmitting microwave energy from a source through the window into the evacuable chamber;
   a workpiece support within the evacuable chamber;
   a magnetic field source including a magnet and a pole piece including:
      a base adjacent to a first pole of the magnet; and
      sidewalls extending around the magnet from the base in a direction substantially parallel to an axis of polarity of the magnet, wherein the sidewalls have a length greater than a length of the magnet; wherein the magnet and the pole piece are configured to change the position or shape of a resonance zone; and
   recurve sections extending from an end of the sidewalls opposite the base towards a central axis of the permanent magnet.

4. The plasma processing device as recited in claim 3, wherein the recurve sections form magnetic mirrors in a magnetic field of the permanent magnet.

5. The plasma processing device as recited in claim 3, wherein the pole piece forms a resonance zone which is concave.

6. The plasma processing device as recited in claim 3, wherein the pole pieces forms a resonance zone which is convex.

7. The plasma processing device as recited in claim 3, wherein the pole pieces forms a resonance zone which is flat.

* * * * *

UNITED STATES PATENT AND TRADEMARK OFFICE
CERTIFICATE OF CORRECTION

PATENT NO. : 6,163,006
DATED : December 19, 2000
INVENTOR(S) : Doughty et al.

It is certified that error appears in the above-identified patent and that said Letters Patent is hereby corrected as shown below:

Column 1,
Line 4, before "BACKGROUND OF THE INVENTION", please insert the heading
-- GOVERNMENT SUPPORT
This invention was made with Government support Contract DE-FG03-97ER82459 awarded by the Department of Energy. The Government has certain rights in this invention. --

Signed and Sealed this

Twelfth Day of October, 2004

JON W. DUDAS
*Director of the United States Patent and Trademark Office*